(12) United States Patent
Wang

(10) Patent No.: US 12,033,549 B2
(45) Date of Patent: Jul. 9, 2024

(54) OLED DISPLAY PANEL AND OLED DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Chaohuan Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/263,144

(22) PCT Filed: Sep. 25, 2020

(86) PCT No.: PCT/CN2020/117754
§ 371 (c)(1),
(2) Date: Mar. 21, 2023

(87) PCT Pub. No.: WO2022/011838
PCT Pub. Date: Jan. 20, 2022

(65) Prior Publication Data
US 2023/0215305 A1    Jul. 6, 2023

(30) Foreign Application Priority Data
Jul. 13, 2020    (CN) .................. 202010669255.2

(51) Int. Cl.
*G09G 3/00*    (2006.01)
*G09G 3/3225*    (2016.01)
*H10K 59/131*    (2023.01)

(52) U.S. Cl.
CPC .......... *G09G 3/006* (2013.01); *G09G 3/3225* (2013.01); *H10K 59/131* (2023.02); *G09G 2310/0202* (2013.01)

(58) Field of Classification Search
CPC ................. G09G 3/006; G09G 3/3225; G09G 2310/0202; H10K 59/131; H10K 59/12; H10K 71/70; H10K 50/84
See application file for complete search history.

(56) References Cited

U.S. PATENT DOCUMENTS

2016/0260367 A1\*   9/2016   Kwak .................. G09G 3/3291
2018/0182274 A1\*   6/2018   Jung ..................... G09G 3/006
(Continued)

FOREIGN PATENT DOCUMENTS

CN    107103869 A    8/2017
CN    107180594 A    9/2017
(Continued)

OTHER PUBLICATIONS

International Search Report in International application No. PCT/CN2020/117754, mailed on Apr. 2, 2021.
(Continued)

*Primary Examiner* — Muhammad N Edun
(74) *Attorney, Agent, or Firm* — PV IP PC; Wei Te Chung; Zhigang Ma

(57) ABSTRACT

An organic light-emitting diode (OLED) display panel and an OLED display device have a display region and a non-display region surrounding the display region. The non-display region includes a bonding region, a first fan-out line region, a bending region, and a second fan-out line region. A bonding test region is arranged between the bonding region and the first fan-out line region, a bonding test circuit is arranged in the bonding test region, and the (Continued)

bonding test circuit is used to detect whether a fan-out data line passing through the bonding region is abnormal.

18 Claims, 2 Drawing Sheets

(56)  References Cited

U.S. PATENT DOCUMENTS

2019/0311662 A1* 10/2019 Kim ..................... G09G 3/2007
2021/0020082 A1*  1/2021 Wang .................... H01L 22/32

FOREIGN PATENT DOCUMENTS

| | | |
|---|---|---|
| CN | 107331294 A | 11/2017 |
| CN | 108400101 A | 8/2018 |
| CN | 110322819 A | 10/2019 |
| CN | 110579917 A | 12/2019 |
| CN | 110676268 A | 1/2020 |
| CN | 110910804 A | 3/2020 |
| CN | 111180609 A | 5/2020 |
| KR | 20170080219 A | 7/2017 |
| TW | 201842389 A | 12/2018 |

OTHER PUBLICATIONS

Written Opinion of the International Searching Authority in International application No. PCT/CN2020/117754, mailed on Apr. 2, 2021.

* cited by examiner

OLED DISPLAY PANEL AND OLED DISPLAY DEVICE

RELATED APPLICATIONS

This application is a Notional Phase of PCT Patent Application No. PCT/CN2020/117754 having international filing date of Sep. 25, 2020, which claims the benefit of priority of Chinese Patent Application No. 202010669255.2 filed on Jul. 13 2020. The contents of the above applications are all incorporated by reference as if fully set forth herein in their entirety.

FIELD OF DISCLOSURE

The present application relates to a field of display technology and in particular, to an organic light-emitting diode (OLED) display panel and an OLED display device.

DESCRIPTION OF RELATED ART

Active-matrix organic light-emitting diode (AMOLED) displays have the advantages such as wide color gamut, a high contrast ratio, energy saving, and foldability, so the AMOLED displays have strong competitiveness among new-generation displays. There are many related products on the market today. Fabrication of the AMOLED displays has undergone development from cell (an array substrate having a cell structure) type to a module type, and the module type fabrication costs high in fabrication and its consumables. Hence, a first bonding process of the module type fabrication is particularly important.

Chip on flexible printed circuit board (i.e., COF, chip being attached onto a flexible printed circuit board) bonding technology is achieved by bonding a COF pad and a panel pad together to realize transmission of a COF signal to a panel. The COF pad comprises gate-on-array (i.e., GOA, array substrate row driving) signals on the left and right sides and data signals in the middle, and there are thousands of data lines. Although whether a data circuit is abnormal in a bonding process can be monitored by measuring a bonding impedance, but this method can only show that there is no problem with the bonding of the test pad, and it does not mean that there is no problem with the bonding of thousands of the data lines. When there is a problem with the bonding of one of the data lines or a few data lines, currently no methods can be used find the problem. Therefore, some panels may have unidentified problems, that is, it is difficult to find the true cause of these abnormal panels. A most commonly used method in conventional techniques is to perform a lighting test for a cell structure in the panel by means of an unbonding technique to distinguish whether there is a problem with the bonding process. However, the unbonding technique is difficult and easily damages the bonding pad, and currently no effective unbonding methods are available for a chip on plastic (COP, wherein a chip is mounted on a plastic substrate) bonding process.

Therefore, it is necessary to provide an OLED display panel to solve the technical problem that abnormal fan-out data lines in a bonding region cannot be effectively detected in conventional techniques.

SUMMARY OF INVENTION

Technical Problem

In conventional organic light-emitting diode (OLED) display panels and OLED display devices, it cannot be effectively detected whether a fan-out data line in a bonding region is abnormal.

Solution to Problem

Technical Solution

In one aspect, the present application provides an organic light emitting diode (OLED) display panel, comprising a display region and a non-display region surrounding the display region, wherein the non-display region comprises a bonding region, a first fan-out line region, a bending region, and a second fan-out line region, the bending region is arranged between the first fan-out line region and the second fan-out line region, the first fan-out line region and the second fan-out line region both comprise a plurality of fan-out data lines, the bonding region is provided with an integrated circuit chip and a plurality of pads, and the fan-out data lines are connected to the pads through the bonding region;

wherein a bonding test region is arranged between the bonding region and the first fan-out line region, a bonding test circuit is disposed in the bonding test region, and the bonding test circuit is configured to detect whether the fan-out data line passing through the bonding region is abnormal.

In the OLED display panel according to one embodiment of the present application, the bonding test circuit comprises a first test input line, a second test input line, a test data line, and a plurality of thin film transistors (TFTs), and the plurality of TFTs are arranged along a first direction.

In the OLED display panel according to one embodiment of the present application, a test data voltage of the test data line ranges from 2V to 5V.

In the OLED display panel according to one embodiment of the present application, materials of the fan-out data line, the first test input line, the second test input line, and the test data line are the same as a material of a source/drain of the TFT.

In the OLED display panel according to one embodiment of the present application, the first test input line and the second test input line are configured to control an on/off state of the plurality of TFTs, and the test data line is configured to input test data signals to the bonding region.

In the OLED display panel according to one embodiment of the present application, the plurality of TFTs are p-type metal oxide semiconductor (PMOS) devices.

In the OLED display panel according to one embodiment of the present application, the plurality of TFTs comprise a first-type TFT and a second-type TFT, a gate of the first-type TFT is connected to the first test input line, a source of the first-type TFT is connected to the test data line, and a drain of the first-type TFT is connected to the fan-out data line; and a gate of the second-type TFT is connected to the second test input line, a source of the second-type TFT is connected to the fan-out data line, and a drain of the second-type TFT is connected to the fan-out data line.

In the OLED display panel according to one embodiment of the present application, when the OLED display panel is in a module test stage, a voltage of the first test input line is a high-level voltage, the first-type TFT is turned off, a voltage of the second test input line is a low-level voltage, the second-type TFT is turned on, and the fan-out data line inputs a first data signal to the bonding region; when the OLED display panel is in a bonding test stage, the voltage of the first test input line is a low-level voltage, the first-type TFT is turned on, the voltage of the second test input line is a high-level voltage, the second-type TFT is turned off, and the test data line inputs a second data signal to the bonding region.

In the OLED display panel according to one embodiment of the present application, when the OLED display panel has a vertical line defect during the module test stage, but has no vertical line defects during the bonding test stage, the fan-out data line located in the bonding region is in an abnormal state.

In a second aspect, the present application provides an OLED display device, comprising an OLED display panel, wherein the OLED display panel comprises a display region and a non-display region surrounding the display region, wherein the non-display region comprises a bonding region, a first fan-out line region, a bending region, and a second fan-out line region, the bending region is arranged between the first fan-out line region and the second fan-out line region, the first fan-out line region and the second fan-out line region are both provided with a plurality of fan-out data lines, the bonding region is provided with an integrated circuit chip and a plurality of pads, and the fan-out data lines are connected to the pads through the bonding region;

wherein a bonding test region is arranged between the bonding region and the first fan-out line region, a bonding test circuit is disposed in the bonding test region, and the bonding test circuit is configured to detect whether the fan-out data line passing through the bonding region is abnormal.

In the OLED display device according to one embodiment of the present application, the bonding test circuit comprises a first test input line, a second test input line, a test data line, and a plurality of thin film transistors (TFTs), and the plurality of TFTs are arranged along a first direction.

In the OLED display device according to one embodiment of the present application, a test data voltage of the test data line ranges from 2V to 5V.

In the OLED display device according to one embodiment of the present application, materials of the fan-out data line, the first test input line, the second test input line, and the test data line are the same as a material of a source/drain of the TFT.

In the OLED display device according to one embodiment of the present application, the first test input line and the second test input line are configured to control an on/off state of the plurality of TFTs, and the test data line is configured to input test data signals to the bonding region.

In the OLED display device according to one embodiment of the present application, the plurality of TFTs are p-type metal oxide semiconductor (PMOS) devices.

In the OLED display device according to one embodiment of the present application, the plurality of TFTs comprise a first-type TFT and a second-type TFT, a gate of the first-type TFT is connected to the first test input line, a source of the first-type TFT is connected to the test data line, and a drain of the first-type TFT is connected to the fan-out data line; and a gate of the second-type TFT is connected to the second test input line, a source of the second-type TFT is connected to the fan-out data line, and a drain of the second-type TFT is connected to the fan-out data line.

In the OLED display device according to one embodiment of the present application, when the OLED display panel is in a module test stage, a voltage of the first test input line is a high-level voltage, the first-type TFT is turned off, a voltage of the second test input line is a low-level voltage, the second-type TFT is turned on, and the fan-out data line inputs a first data signal to the bonding region; when the OLED display panel is in a bonding test stage, the voltage of the first test input line is a low-level voltage, the first-type TFT is turned on, the voltage of the second test input line is a high-level voltage, the second-type TFT is turned off, and the test data line inputs a second data signal to the bonding region.

In the OLED display device according to one embodiment of the present application, when the OLED display panel has a vertical line defect during the module test stage, but has no vertical line defects during the bonding test stage, the fan-out data line located in the bonding region is in an abnormal state.

Advantages of Invention

Beneficial Effect

Compared with conventional techniques, the OLED display panel and the OLED display device of the present application are provided with the bonding test circuit above the bonding region, which can effectively detect whether the fan-out data line in the bonding region is abnormal, and thereby improve the production yields of the OLED display panels.

BRIEF DESCRIPTION OF DRAWINGS

Description of Attached Drawings

EMBODIMENTS OF INVENTION

Detailed Description of Preferred Embodiments

The present application is directed to solving a technical problem in conventional techniques. Conventional techniques cannot effectively detect whether a fan-out data line in a bonding region is abnormal in an organic light-emitting diode (OLED) display panel and an OLED display device.

Figure 1:
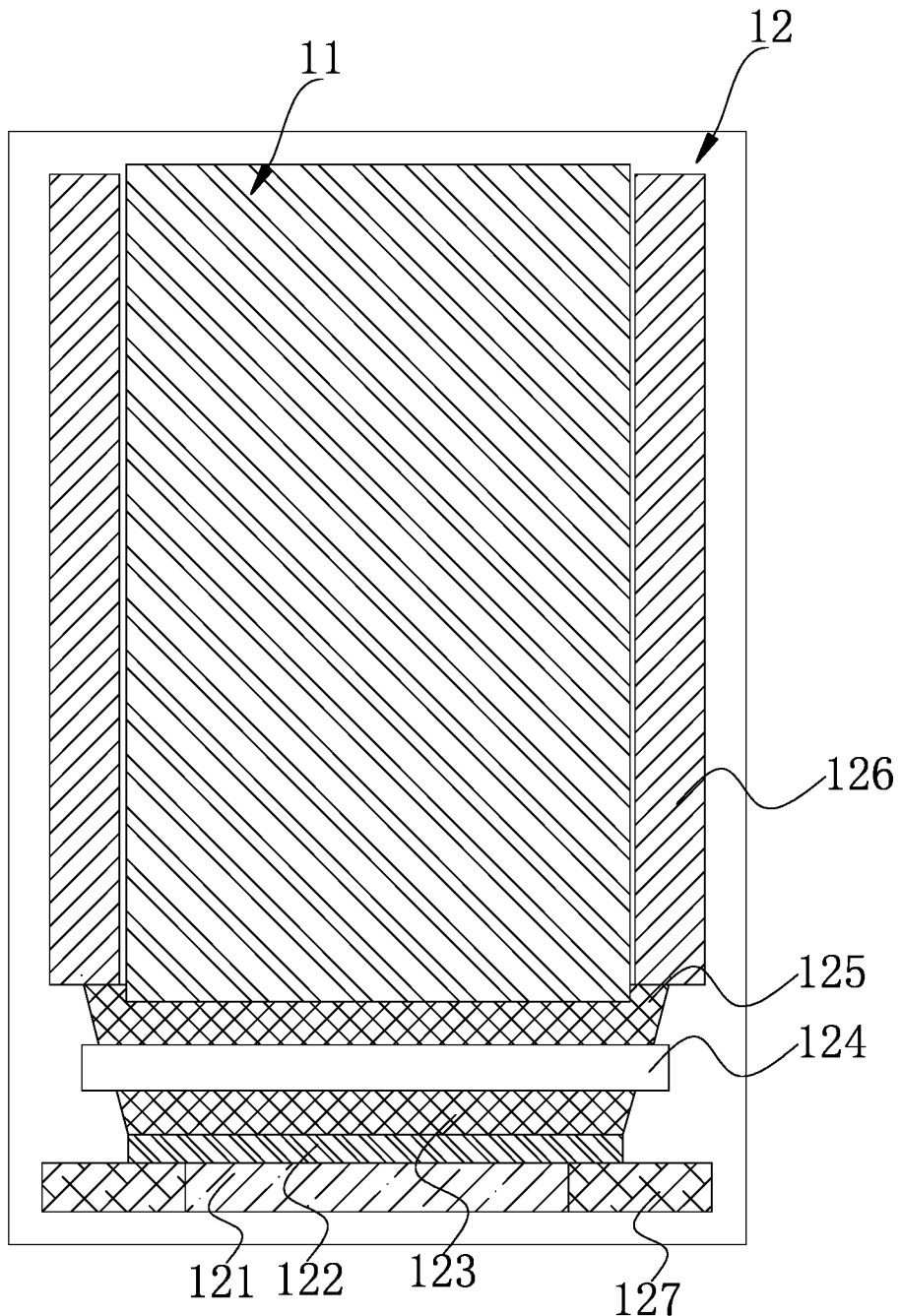
FIG. 1 is a schematic plan view of an organic light-emitting diode (OLED) display panel according to one embodiment of the present application.

Referring to FIG. 1, it is a schematic plan view of an organic light-emitting diode (OLED) display panel according to one embodiment of this application. The drawing illustrates components of the present embodiment and a relative positional relationship between the components.

The OLED display panel has a display region 11 and a non-display region 12 surrounding the display region 11. The non-display region 12 comprises a bonding region 121, a first fan-out line region 123, a bending region 124, and a second fan-out line region 125. The bending region 124 is located between the first fan-out line region 123 and the second fan-out line region 125. The first fan-out line region 123 and the second fan-out line region 125 are both provided with a plurality of fan-out data lines, the bonding region 121 is provided with an integrated circuit chip and a plurality of pads, and the fan-out data lines are connected to the pads through the bonding region 121.

Specifically, a bonding test region 122 is arranged between the bonding region 121 and the first fan-out line region 123, and a bonding test circuit is disposed in the bonding test region 122, and the bonding test circuit is configured to detect whether the fan-out data line passing through the bonding region 121 is abnormal.

Further, the non-display region 12 is provided with gate-on-array (GOA) lines 126 near two edges of the display region 11, and the GOA lines 126 are configured to provide scan signals for pixels in the display region 11.

Further, two ends of the bonding region 121 are provided with cell test pads 127, and the cell test pads are configured to perform a cell test on the OLED display panel.

Figure 2:
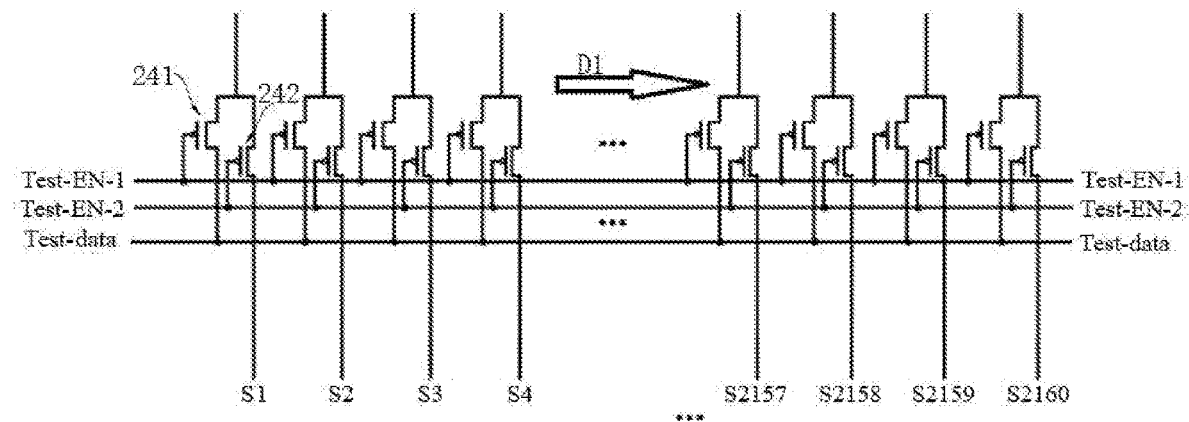
FIG. 2 is a schematic diagram illustrating a bonding test circuit in the OLED display panel according to one embodiment of the application.

As shown in FIG. 2, a schematic diagram illustrating a bonding test circuit in the OLED display panel according to one embodiment of the present application (the embodiment has 2160 fan-out data lines as an example). The bonding test circuit comprises a first test input line (Test-EN-1), a second test input line (Test-EN-2), a test data line (Test-data), and a plurality of thin film transistors (TFTs). The TFTs are all arranged along a first direction D1. The first test input line (Test-EN-1), the second test input line (Test-EN-2), and the test data line (Test-data) are all connected to the bonding region 121. That is, three pins are added in the bonding regions 121 on the left and right sides with respect to a first fan-out data line (S1) and a 2160th fan-out data line (S2160), so as to provide signals to the TFT.

Selectively, a test data voltage of the test data line ranges from 2V to 5V, and the voltage needs to be sufficient to light up the OLED display panel.

Selectively, materials of the fan-out data lines (S1, S2 . . . S2159, S2160), the first test input line (Test-EN-1), the second test input line (Test-EN-2), and the test data line (Test-data) are the same as a material of a source/drain in the TFT. Selectively, the material of the source/drain is one of molybdenum (Mo), aluminum (Al), copper (Cu), and titanium (Ti), or a combination thereof.

Specifically, the first test input line (Test-EN-1) and the second test input line (Test-EN-2) are configured to control an on/off state of the TFTs, and the test data line (Test-data) is configured to input test data signals to the bonding region 121.

Specifically, all the TFTs are P-type metal oxide semiconductor field effect transistor (PMOS) devices, and are turned on at a low level and turned off at a high level.

Selectively, the TFTs comprise a first-type TFT 241 and a second-type TFT 242, and a gate of the first-type TFT 241 is connected to the first test input line (Test-EN-1). A source of the first-type TFT 241 is connected to the test data line (Test-data), and a drain of the first-type TFT 241 is connected to the fan-out data lines (S1, S2 . . . S2159, S2160). A gate of the second-type TFT 242 is connected to the second test input line (Test-EN-2), and a source of the second-type TFT 242 is connected to the fan-out data lines (S1, S2 . . . S2159, S2160), and a drain of the second-type TFT 242 is connected to the fan-out data lines (S1, S2 . . . S2159, S2160). Selectively, when the OLED display panel is in a module test stage, a voltage of the first test input line (Test-EN-1) is a high-level voltage, the first-type TFT 241 is turned off, and a voltage of the second test input line (Test-EN-2) is a low-level voltage, the second-type TFT 242 is turned on, and the fan-out data lines (S1, S2 . . . S2159, S2160) input the first data signal to the bonding region 121.

Selectively, when the OLED display panel is in a bonding test stage, the voltage of the first test input line (Test-EN-1) is a low-level voltage, and the first-type TFT 241 is turned on, the voltage of the second test input line (Test-EN-2) is a high-level voltage, the second-type TFT 242 is turned off, and the test data line (Test-data) inputs a second data signal to the bonding region 121.

In detail, when the OLED display panel has vertical line defects during the module test stage, and the OLED display panel still has vertical line defects during the bonding test stage, then it can be determined that the fan-out data lines (S1, S2 . . . S2159, S2160) located in the bonding region 121 are not abnormal; when the OLED display panel has vertical line defects during the module test stage, and the OLED display panel does not have vertical line defects in the bonding test stage, then it can be determined that the fan-out data lines (S1, S2 . . . S2159, S2160) located in the bonding region 121 are abnormal.

Figure 3:
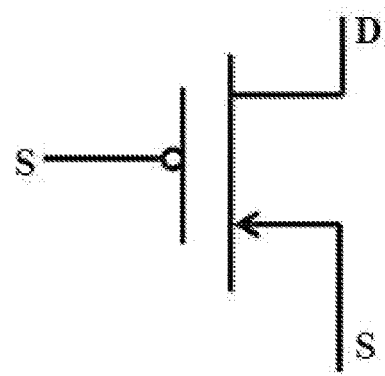
FIG. 3 is a schematic diagram of a thin film transistor switch circuit in the OLED display panel according to one embodiment of the present application.

As shown in FIG. 3, it is a schematic diagram of a TFT switch circuit in an OLED display panel according to one embodiment of the present application. The TFT switch controls the writing of the test data line (Test-data) or the fan-out data line.

By adding the TFT switch, the bonding test circuit of the present application can detect whether there is a problem with the fan-out data line connected to the bonding region, so as to quickly identify the problem and improve production efficiency.

For the above operations in practice, please refer to the previous embodiments, and a detailed description is not repeated here for brevity.

In summary, the OLED display panel and the OLED display device of the present application are provided with the bonding test circuit above the bonding region, which can effectively detect whether the fan-out data line in the bonding region is abnormal, and thereby improve the production yields of the OLED display panels.

It can be understood that for those of ordinary skill in the art, equivalent substitutions or changes can be made according to the technical solutions and inventive concepts of the present application, and all these changes or substitutions shall fall within the protection scope of the appended claims of the present application.

What is claimed is:

1. An organic light emitting diode (OLED) display panel, comprising a display region and a non-display region surrounding the display region, wherein the non-display region comprises a bonding region, a first fan-out line region, a bending region, and a second fan-out line region, the bending region is arranged between the first fan-out line region and the second fan-out line region, the first fan-out line region and the second fan-out line region both comprise a plurality of fan-out data lines, the bonding region is provided with an integrated circuit chip and a plurality of pads, and the fan-out data lines are connected to the pads through the bonding region, wherein a bonding test region is arranged between the bonding region and the first fan-out line region, a bonding test circuit is disposed in the bonding test region, and the bonding test circuit is configured to detect whether the fan-out data line passing through the bonding region is abnormal; and wherein the bonding test circuit comprises a first test input line, a second test input line, a test data line, and a plurality of thin film transistors (TFTs), and the plurality of TFTs are arranged along a first direction, wherein materials of the fan-out data line, the first test input line, the second test input line, and the test data line are the same as a material of a source/drain of the TFT.

2. The OLED display panel according to claim 1, wherein a test data voltage of the test data line ranges from 2V to 5V.

3. The OLED display panel according to claim 1, wherein the first test input line and the second test input line are configured to control an on/off state of the plurality of TFTs, and the test data line is configured to input test data signals to the bonding region.

4. The OLED display panel according to claim 1, wherein the plurality of TFTs are p-type metal oxide semiconductor (PMOS) devices.

5. The OLED display panel according to claim 4, wherein the plurality of TFTs comprise a first-type TFT and a second-type TFT, a gate of the first-type TFT is connected to the first test input line, a source of the first-type TFT is connected to the test data line, and a drain of the first-type TFT is connected to the fan-out data line; and a gate of the second-type TFT is connected to the second test input line, a source of the second-type TFT is connected to the fan-out data line, and a drain of the second-type TFT is connected to the fan-out data line.

6. The OLED display panel according to claim 5, wherein when the OLED display panel is in a module test stage, a voltage of the first test input line is a high-level voltage, the first-type TFT is turned off, a voltage of the second test input line is a low-level voltage, the second-type TFT is turned on, and the fan-out data line inputs a first data signal to the bonding region; when the OLED display panel is in a bonding test stage, the voltage of the first test input line is a low-level voltage, the first-type TFT is turned on, the voltage of the second test input line is a high-level voltage, the second-type TFT is turned off, and the test data line inputs a second data signal to the bonding region.

7. The OLED display panel according to claim 6, wherein when the OLED display panel has a vertical line defect during the module test stage, but has no vertical line defects during the bonding test stage, the fan-out data line located in the bonding region is in an abnormal state.

8. An OLED display device, comprising an OLED display panel, wherein the OLED display panel comprises a display region and a non-display region surrounding the display region, wherein the non-display region comprises a bonding region, a first fan-out line region, a bending region, and a second fan-out line region, the bending region is arranged between the first fan-out line region and the second fan-out line region, the first fan-out line region and the second fan-out line region are both provided with a plurality of fan-out data lines, the bonding region is provided with an integrated circuit chip and a plurality of pads, and the fan-out data lines are connected to the pads through the bonding region,
wherein a bonding test region is arranged between the bonding region and the first fan-out line region, a bonding test circuit is disposed in the bonding test region, and the bonding test circuit is configured to detect whether the fan-out data line passing through the bonding region is abnormal; and
wherein the bonding test circuit comprises a first test input line, a second test input line, a test data line, and a plurality of thin film transistors (TFTs), and the plurality of TFTs are arranged along a first direction, wherein materials of the fan-out data line, the first test input line, the second test input line, and the test data line are the same as a material of a source/drain of the TFT.

9. The OLED display device according to claim 8, wherein a test data voltage of the test data line ranges from 2V to 5V.

10. The OLED display device according to claim 8, wherein the first test input line and the second test input line are configured to control an on/off state of the plurality of TFTs, and the test data line is configured to input test data signals to the bonding region.

11. The OLED display device according to claim 8, wherein the plurality of TFTs are p-type metal oxide semiconductor (PMOS) devices.

12. The OLED display device according to claim 11, wherein the plurality of TFTs comprise a first-type TFT and a second-type TFT, a gate of the first-type TFT is connected to the first test input line, a source of the first-type TFT is connected to the test data line, and a drain of the first-type TFT is connected to the fan-out data line; and a gate of the second-type TFT is connected to the second test input line, a source of the second-type TFT is connected to the fan-out data line, and a drain of the second-type TFT is connected to the fan-out data line.

13. The OLED display device according to claim 12, wherein when the OLED display panel is in a module test stage, a voltage of the first test input line is a high-level voltage, the first-type TFT is turned off, a voltage of the second test input line is a low-level voltage, the second-type TFT is turned on, and the fan-out data line inputs a first data signal to the bonding region; when the OLED display panel is in a bonding test stage, the voltage of the first test input line is a low-level voltage, the first-type TFT is turned on, the voltage of the second test input line is a high-level voltage, the second-type TFT is turned off, and the test data line inputs a second data signal to the bonding region.

14. The OLED display device according to claim 13, wherein when the OLED display panel has a vertical line defect during the module test stage, but has no vertical line defects during the bonding test stage, the fan-out data line located in the bonding region is in an abnormal state.

15. An organic light emitting diode (OLED) display panel, comprising a display region and a non-display region surrounding the display region, wherein the non-display region comprises a bonding region, a first fan-out line region, a bending region, and a second fan-out line region, the bending region is arranged between the first fan-out line region and the second fan-out line region, the first fan-out line region and the second fan-out line region both comprise a plurality of fan-out data lines, the bonding region is provided with an integrated circuit chip and a plurality of pads, and the fan-out data lines are connected to the pads through the bonding region,
wherein a bonding test region is arranged between the bonding region and the first fan-out line region, a bonding test circuit is disposed in the bonding test region, and the bonding test circuit is configured to detect whether the fan-out data line passing through the bonding region is abnormal;
wherein the bonding test circuit comprises a first test input line, a second test input line, a test data line, and a plurality of thin film transistors (TFTs), the plurality of TFTs are arranged along a first direction, and the plurality of TFTs are p-type metal oxide semiconductor (PMOS) devices; and
wherein the plurality of TFTs comprise a first-type TFT and a second-type TFT, a gate of the first-type TFT is connected to the first test input line, a source of the first-type TFT is connected to the test data line, and a drain of the first-type TFT is connected to the fan-out data line; and a gate of the second-type TFT is connected to the second test input line, a source of the second-type TFT is connected to the fan-out data line, and a drain of the second-type TFT is connected to the fan-out data line.

16. The OLED display panel according to claim 15, wherein a test data voltage of the test data line ranges from 2V to 5V.

17. The OLED display panel according to claim 15, wherein the first test input line and the second test input line are configured to control an on/off state of the plurality of TFTs, and the test data line is configured to input test data signals to the bonding region.

18. The OLED display panel according to claim 15, wherein when the OLED display panel is in a module test stage, a voltage of the first test input line is a high-level voltage, the first-type TFT is turned off, a voltage of the second test input line is a low-level voltage, the second-type TFT is turned on, and the fan-out data line inputs a first data signal to the bonding region; when the OLED display panel is in a bonding test stage, the voltage of the first test input line is a low-level voltage, the first-type TFT is turned on, the voltage of the second test input line is a high-level voltage, the second-type TFT is turned off, and the test data line inputs a second data signal to the bonding region.

* * * * *